United States Patent [19]

Penn et al.

[11] Patent Number: 4,737,736
[45] Date of Patent: Apr. 12, 1988

[54] METHOD AND SYSTEM FOR STABILIZING AND LINEARIZING THE OUTPUT OF A VOLTAGE-TO-FREQUENCY CONVERTER

[75] Inventors: Paul E. Penn, Indianapolis; Roger A. Werckman, Jr., Carmel, both of Ind.

[73] Assignee: Dart Controls, Inc., Zionsville, Ind.

[21] Appl. No.: 894,276

[22] Filed: Aug. 7, 1986

[51] Int. Cl.⁴ .............................................. H03L 7/06
[52] U.S. Cl. .................................... 331/1 R; 331/145; 331/175; 331/177 R
[58] Field of Search .................. 331/1 R, 143, 177 R, 331/145, 175

[56] References Cited

U.S. PATENT DOCUMENTS 3,754,194  8/1973  Camp, Jr. .......................... 331/1 R
4,520,327  5/1985  Myers .............................. 331/177 R

*Primary Examiner*—Eugene R. LaRoche
*Assistant Examiner*—David Mis
*Attorney, Agent, or Firm*—Barnes & Thornburg

[57] ABSTRACT

A system for stabilizing the output of a voltage-to-frequency (V/F) converter having an input terminal and an output terminal. The system comprises a single-shot having an input terminal and an output terminal. The output terminal of the V/F converter is coupled to the input terminal of the single-shot. An integrator comprising an operational amplifier is coupled in integrating amplifier configuration for coupling the output terminal of the single-shot to the input terminal of the V/F converter. The operational amplifier comprises a difference amplifier. The integrator includes a capacitor coupled between one of the input terminals of the difference amplifier and the output terminal of the difference amplifier. The output terminal of the difference amplifier is coupled to the input terminal of the V/F converter.

9 Claims, 1 Drawing Sheet

U.S. Patent    Apr. 12, 1988    4,737,736
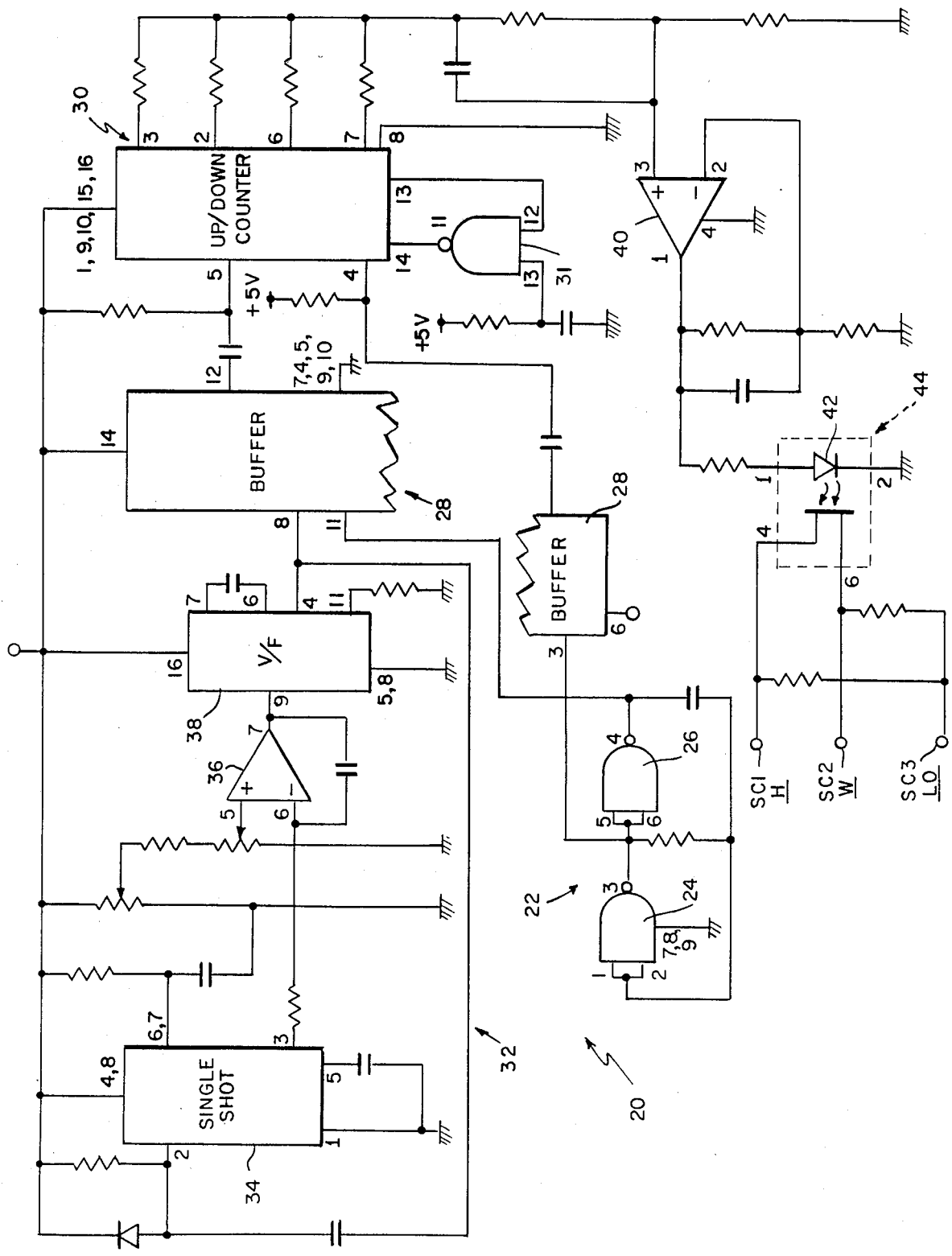

METHOD AND SYSTEM FOR STABILIZING AND LINEARIZING THE OUTPUT OF A VOLTAGE-TO-FREQUENCY CONVERTER

This invention relates to a system for linearizing the output of a voltage-to-frequency converter when the converter is used in, for example, an oscillator. The system of the invention thus makes the oscillator substantially drift-free.

When integrated circuit voltage-to-frequency (V/F) converters are used in oscillators and other circuits, a problem is encountered with the stability of the V/F converter. Typically the output signal from the V/F converter varies with factors such as changes in operating conditions. This ordinarily is not desirable but is tolerated in applications in which high accuracy of V/F converter output frequency is not essential.

According to the present invention a system for stabilizing the output frequency of a V/F converter is provided. The V/F converter includes an input terminal for receiving a voltage signal and an output terminal at which a signal at a frequency related to the received voltage signal is produced. The system includes a single-shot and an integrator. The single-shot and the integrator each include an input terminal and an output terminal. Means are provided for coupling the output terminal of the V/F converter to the input terminal of the single-shot. Means are provided for coupling the output terminal of the single-shot to an input terminal of the integrator. Further means are provided for coupling the output terminal of the integrator to the input terminal of the V/F converter.

According to an illustrative embodiment, the integrator comprises an operational amplifier, a capacitor, and means for coupling the capacitor across the output terminal and an input terminal of the operational amplifier.

Illustratively, the operational amplifier is a difference amplifier having two input terminals. The capacitor is coupled to a first of these. The system further includes a potentiometer for generating a desired frequency signal. Means are provided for coupling a terminal of the potentiometer to the second input terminal of the difference amplifier. The signal on the output terminal of the difference amplifier and the input terminal of the V/F converter is thus an error signal related to the difference between the output frequency of the V/F converter and the desired frequency signal from the potentiometer.

According to another aspect of the invention, a method for controlling and stabilizing the output frequency of a V/F converter comprises providing the output frequency signal from the V/F converter to an input terminal of a single-shot, integrating the output signal from the single-shot, and supplying the integrated output to the input terminal of the V/F converter.

According to an illustrative embodiment of the invention, the step of integrating the output signal from the single-shot comprises the step of coupling the output signal from the single-shot to an input terminal of an operational amplifier with a capacitor coupled in integrating configuration between an input terminal to the operational amplifier and the output terminal from the operational amplifier.

Illustratively, the method includes the further step of providing a desired frequency signal, with the operational amplifier comprising a difference amplifier, the output signal from the single-shot being coupled to one input terminal of the difference amplifier and the desired frequency signal being coupled to the other input terminal of the difference amplifier.

Illustratively, the step of generating a desired frequency signal comprises the steps of providing a potentiometer and coupling a terminal of the potentiometer to an input terminal of the difference amplifier to provide the desired speed signal.

According to another aspect of the invention, a substantially drift-free oscillator comprises a single-shot having an input terminal and an output terminal, a V/F converter having an input terminal and an output terminal, means for coupling the output terminal of the V/F converter to the input terminal of the single-shot, and an integrator for coupling the output terminal of the single-shot to the input terminal of the V/F converter. The output terminal of the V/F converter forms the output terminal of the oscillator.

Illustratively, the integrator comprises an operational amplifier coupled in integrating amplifier configuration. According to the illustrative embodiment, the operational amplifier comprises a difference, or differential, amplifier, and the integrator includes a capacitor, means for coupling the capacitor between one of the input terminals of the difference amplifier and the output terminal of the difference amplifier, and means for coupling the output terminal of the difference amplifier to the input terminal of the V/F converter.

Further according to the illustrative embodiment, the oscillator comprises a "set frequency" means for establishing a desired oscillator output frequency. Illustratively, the "set frequency" means comprises a potentiometer, means for coupling the potentiometer across a voltage source, and means for coupling an adjustable terminal of the potentiometer to the remaining input terminal of the difference amplifier.

The invention may best be understood by referring to the following description and accompanying drawing which illustrates the invention. The drawing is a schematic circuit diagram of a circuit incorporating the method and system for linearizing and stabilizing the output signal from a V/F converter.

Referring now to the drawing, a motor speed control circuit 20 for a DC motor (not shown) of the type found in, for example, a pizza oven includes a main, or "housekeeping", clock circuit 22. Circuit 22 includes NAND gates 24, 26. The output terminal of NAND gate 24 is coupled to the input terminals of NAND gate 26. Feedback is provided from the output terminal of NAND gate 24 to its input terminal through a 15K resistor. Feedback is provided from the output terminal of NAND gate 26 to the input terminals of NAND gate 24 through a 0.001 μF, 1KV capacitor. Feedback from the output terminal of NAND gate 26 to the input terminal of NAND gate 26 is provided through both the 0.001 μF capacitor and the 15K resistor. Illustratively, NAND gates 24, 26 are type 4011 NAND gates available from, for example, Motorola Semiconductor. The pin numbers marked on the drawing are the pin numbers which are used when the Motorola 4011 is used in the circuit realization. This convention will be followed throughout this specification, except as otherwise indicated.

The output terminal, pin 4, of NAND gate 26 is coupled to an input terminal, pin 11, of a buffer integrated circuit 28. The output terminal, pin 3, of NAND gate 24 is coupled to pin 3 of buffer 28. Buffer 28 illustratively is a type 4013 integrated circuit available from, for example, Motorola Semiconductor. An output terminal, pin 12, of buffer 28 is coupled through a 0.001 μF, 1 KV capacitor to an input terminal, pin 5, of an up/down counter 30. An output terminal, pin 2, of buffer 28 is coupled through a 0.001 μF, 1KV capacitor to an input terminal, pin 4, of counter 30. Pins 4, 5 of counter 30 are both coupled through respective 2.2K pull-up resistors to +5 VDC. Pin 5 forms the "up count" input terminal of counter 30. Pin 4 forms the "down count" terminal of counter 30. Counter 30 illustratively is a type 40193 4-bit binary counter available from, for example, Motorola Semiconductor.

Pins 1, 9, 10, 15 and 16 of up/down counter 30 are coupled to +5 VDC. Pin 8 of up/down counter 30 is coupled to ground. The series combination of a 100K resistor and a 4.7 μF capacitor is coupled between +5 VDC and ground. The junction of this resistor and capacitor is coupled to an input terminal of a NAND gate 31. Gate 31 illustratively is a type 4011 NAND gate available from, for example, Motorola Semiconductor. The other input terminal of NAND gate 31 is coupled to pin 13 of up/down counter 30. The output terminal of NAND gate 31 is coupled to pin 14 of up/down counter 31.

The input signals to the counter 30 which are counted and set off against each other are provided from two sources. One source is pulse feedback to pin 6 of buffer 28 from a Hall effect device of the type described in U.S. Pat. No. 4,376,915. This is the source of count down pulses. The source of count up pulses is a substantially drift-free oscillator 32.

The drift-free oscillator 32 includes a single-shot integrated circuit 34, such as a type 7555 integrated single-shot available from, for example, Texas Instruments. +5 VDC is coupled to pins 4, 8 of single-shot 34, and through a 10K resistor to pin 2 of single-shot 34. The anode of a type S1872 diode is coupled to pin 2 of single-shot 32 and its cathode is coupled to +5 VDC. Pin 1 of single-shot 34 is coupled to ground. Pin 5 of single-shot 34 is coupled through a 0.1 μF, 200 VDC capacitor to ground. Pins 6, 7 of single-shot 34 are coupled to the junction of a 10K, 1% resistor and a 0.1 μF, 200 VDC capacitor which form the timing circuit of the single-shot 34. The remaining terminal of the 10K, 1% resistor is coupled to +5 VDC. The remaining terminal of the 0.1 μF capacitor of the timing circuit is coupled to ground.

The output signal from single-shot 34 appears at pin 3 thereof. The signal is coupled through a 100K resistor to the − input terminal of a difference amplifier 36. Difference amplifier 36 is coupled in an integrator configuration, with a 0.1 μF, 200 VDC capacitor coupled between its − input terminal and its output terminal. An oscillator frequency selecting potentiometer configuration includes a 5K potentiometer coupled between +5 VDC and ground. The wiper of this potentiometer is coupled through a 220K resistor and a 20K potentiometer to ground. The wiper of the 20K potentiometer is coupled to the + input terminal of difference amplifier 36. Illustratively, difference amplifier 36 is a type 358 integrated circuit available from, for example, National Semiconductor. The output terminal of difference amplifier 36 is coupled to an input terminal, pin 9, of a V/F converter integrated circuit 38. V/F integrated circuit 38 illustratively is a type 4046 V/F available from, for example, Motorola Semiconductor. Pins 5, 8 of V/F 38 are coupled to ground. Pin 11 of V/F 38 is coupled through a 100K resistor to ground. Pin 16 of V/F 38 is coupled to +5 VDC. A 0.1 μF, 200 VDC capacitor is coupled between pins 6 and 7 of V/F 38. Pin 4 of V/F 38 forms the output terminal of oscillator 32. Feedback is provided from pin 4 of V/F 38 through a 0.001 μF, 1KV capacitor to pin 2 of single-shot 34. Pin 4 of V/F 38 is also coupled to an input terminal, pin 8, of buffer 28.

Up counts from oscillator 32, buffered by buffer 28, appear at pin 5 of up/down counter 30. Down counts from the Hall effect device coupled to pin 6 of buffer 28 appear at pin 4 of up/down counter 30. The housekeeping clock 22 provides oppositely phased clock signals to pins 11, 3 of buffer 28 to insure that the up and down count signals coupled to pins 5, 4, respectively, of up/down counter 30 do not arrive at these pins at the same time. Rather, they arrive alternately. The four output bits of the up/down counter 30 appear at pins 7, 6, 2 and 3 thereof. These output bits are weighted on an approximately 8-4-2-1 basis by 10K, 22K, 39K and 82K resistors coupled between respective pins 7, 6, 2, 3 and a common terminal.

This common terminal is coupled through series 470K and 47K resistors to ground. The potential across the 470K resistor also appears across a 0.1 μF, 200 VDC capacitor which is coupled in parallel with the 470K resistor. The potential across the 47K resistor is coupled to the + input terminal of a difference amplifier 40. The output terminal of difference amplifier 40 is coupled through a parallel RC circuit including a 0.01 μF capacitor and a 470K resistor to the − input terminal of the difference amplifier 40. The − input terminal of difference amplifier 40 is also coupled to ground through a 47K resistor. The output terminal of difference amplifier 40 is also coupled through a 470 ohm resistor to the anode of a LED 42. The cathode of LED 42 is coupled to ground. The drain, pin 4 of a light activated field effect transistor 44 forms an output terminal H of the motor control circuit 20. The source, pin 6 of FET 44 forms an output terminal W of circuit 20. An output terminal LO from the circuit 20 is coupled through a 220K resistor to the source, pin 6, of FET 44. A 10K resistor is coupled between output terminals H and LO of circuit 20. LED 42 and FET 44 illustratively are packaged together as a type H11F1 circuit avaiable from, for example, General Electric.

What is claimed is:

1. A system for stabilizing the output of a voltage-to-frequency (V/F) converter having an input terminal and an output terminal, the system comprising a single-shot having an input terminal and an output terminal, means for coupling the output terminal of the V/F converter to the input terminal of the single-shot, and an integrator comprising an operational amplifier coupled in integrating amplifier configuration for coupling the output terminal of the single-shot to the input terminal of the V/F converter, the operational amplifier comprising a difference amplifier, the integrator including a capacitor, means for coupling the capacitor between one of the input terminals of the difference amplifier and its output terminal, and means for coupling the output terminal of the difference amplifier to the input terminal of the V/F converter.

2. The system of claim 1 and further comprising means for establishing a desired V/F converter output frequency.

3. The system of claim 2 wherein the means for establishing a desired V/F converter output frequency comprises a potentiometer, means for coupling the potentiometer across a voltage source, and means for coupling a terminal of the potentiometer to the remaining input terminal of the difference amplifier.

4. A substantially drift-free oscillator comprising a single-shot having an input terminal and an output terminal, a voltage-to-frequency (V/F) converter having an input terminal and an output terminal, means for coupling the output terminal of the V/F converter to the input terminal of the single-shot, and an integrator comprising an operational amplifier coupled in integrating amplifier configuration for coupling the output terminal of the single-shot to the input terminal of the V/F converter, the output terminal of the V/F converter forming the output terminal of the oscillator, the operational amplifier comprising a difference amplifier, the integrator including a capacitor, means for coupling the capacitor between one of the input terminals of the difference amplifier and its output terminal, and means for coupling the output terminal of the difference amplifier to the input terminal of the V/F converter.

5. The apparatus of claim 4 and further comprising means for establishing a desired V/F converter output frequency.

6. The apparatus of claim 5 wherein the means for establishing a desired V/F converter output frequency comprises a potentiometer, means for coupling the potentiometer across a voltage source, and means for coupling a terminal of the potentiometer to the remaining input terminal of the difference amplifier.

7. A method for stabilizing the output of a voltage-to-frequency (V/F) converter having an input terminal and an output terminal, the method comprising providing a single-shot having an input terminal and an output terminal, coupling the output terminal of the V/F converter to the input terminal of the single-shot, and providing an integrator including an operational amplifier coupled in integrating configuration for coupling the output terminal of the single-shot to the input terminal of the V/F converter, the step of providing an operational amplifier comprising the steps of providing a difference amplifier and a capacitor, coupling the capacitor between one of the input terminals of the difference amplifier and its output terminal, and coupling the output terminal of the difference amplifier to the input terminal of the V/F converter.

8. The method of claim 7 and further comprising establishing a desired V/F converter output frequency.

9. The method of claim 8 wherein the step of establishing a desired V/F converter output frequency comprises the steps of providing a potentiometer, coupling the potentiometer across a voltage source, and coupling a terminal of the potentiometer to the remaining input terminal of the difference amplifier.

* * * * *